US011550377B2

(12) United States Patent
Cassagnes et al.

(10) Patent No.: US 11,550,377 B2
(45) Date of Patent: Jan. 10, 2023

(54) INTEGRATED CIRCUIT, METHOD FOR RESETTING AND COMPUTER PROGRAM PRODUCT

(71) Applicant: STMICROELECTRONICS (ROUSSET) SAS, Rousset (FR)

(72) Inventors: Herve Cassagnes, Salon-de-Provence (FR); Cyril Moulin, Aix en Provence (FR); Jean-Michel Gril-Maffre, Aix-en-Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/396,070

(22) Filed: Aug. 6, 2021

(65) Prior Publication Data

US 2022/0066524 A1 Mar. 3, 2022

(30) Foreign Application Priority Data

Aug. 27, 2020 (FR) ....................................... 2008759

(51) Int. Cl.

*H03K 3/00* (2006.01)
*G06F 1/24* (2006.01)
*H03K 17/22* (2006.01)
*H03K 19/17736* (2020.01)
*H03K 3/012* (2006.01)

(52) U.S. Cl.

CPC ............... *G06F 1/24* (2013.01); *H03K 3/012* (2013.01); *H03K 17/223* (2013.01); *H03K 19/1774* (2013.01)

(58) Field of Classification Search

None
See application file for complete search history.

(56) References Cited

U.S. PATENT DOCUMENTS 5,109,506 A 4/1992 Begun
5,675,272 A * 10/1997 Chu ................ G01R 19/16528 327/57
10,719,331 B2 7/2020 Froidevaux et al.
2005/0253638 A1* 11/2005 Dietrich .................... G06F 1/24 327/198
2010/0237913 A1* 9/2010 Nishioka .................. G06F 1/24 327/143
2017/0089708 A1* 3/2017 Lee ....................... G01C 21/20

FOREIGN PATENT DOCUMENTS

EP 3 171 244 A1 5/2017

* cited by examiner

*Primary Examiner* — Tuan T Lam
(74) *Attorney, Agent, or Firm* — Seed Intellectual Property Law Group LLP

(57) ABSTRACT

Integrated circuit, method for resetting and computer program product. The integrated circuit comprises a first portion and a second portion. The first portion comprises a reset input configured to receive a reset signal, an activation module connected to the reset input. The activation module is configured to activate the second portion upon reception of the reset signal. The first portion comprises an emissions module configured to emit a replicated reset signal. The second portion can be selectively activated or deactivated. The second portion comprises a reset input configured to receive the replicated reset signal of the emissions module, a determination module configured to determine that an elapsed time starting from the activation of the second portion of the circuit oversteps a threshold.

19 Claims, 4 Drawing Sheets

CINT
PART1
PART2
RST1
11A
13A
13C
EMI
G
23
21B
18A
G1
18B
RST2
28
14B
12 ACTIV
22
21A
21C
22A
ISO
ACTIV1
14A
13D
23A
ETAT
L
13E
BASC
23B
13F
STOCK
13G
13B
DEPAS
11B
29
19B
G2
19A
14C
7 UNIT
5 CLOCK
25
CLK
DET
DEPAS
26
H
16B
26A
BASC1
16D
26B
BASC2
16A
16E
16F
16
16G
24

INTEGRATED CIRCUIT, METHOD FOR RESETTING AND COMPUTER PROGRAM PRODUCT

BACKGROUND

Technical Field

The present disclosure relates to, generally, integrated circuits comprising several portions of which some of these portions can be selectively placed in an operating mode of the standby type (hereinafter standby operating mode) or in an operating mode of the active type (hereinafter active operating mode).

Description of the Related Art

An integrated circuit, also called electronic chip, is an electronic component, comprising a single wafer of semiconductor material. The integrated circuit is usually configured to implement several functions and generally comprises, for this purpose, several types of basic electronic components.

The integrated circuit generally has the form of a solid case, rectangular, provided on one or more sides, or even on one face, with pins that make it possible to establish electrical connections with elements outside the case.

A portion of the integrated circuit can be selectively placed in an active operating mode or a standby operating mode. The standby operating mode is also known under the expression low power mode. In the standby operating mode the supply voltage of the portion of the integrated circuit is therefore lowered with respect to the supply voltage used when the portion of the integrated circuit is in active operating mode.

A first supply voltage is generally fixed to be sufficient to retain the information recorded in a memory present in the portion of integrated circuit supplied by this voltage. This first supply voltage is also sufficient to allow for the resetting of the portion of integrated supplied by this voltage.

Alternatively, it is also possible to use a second supply voltage less than the first voltage which is also sufficient to retain the information recorded in the memory present in the portion of the integrated circuit supplied by this voltage.

However this second voltage can be insufficient to allow for the resetting of the portion of the integrated circuit supplied by this voltage.

Then, a problem occurs when a portion of the integrated circuit receives a reset signal, if this portion of the integrated circuit is supplied by a voltage comprised between the first voltage and the second voltage (for example comprised between 0.66V and 0.9V), indeed in this case the portion of the integrated circuit is not reset.

There is therefore a need to have an integrated circuit that allows for the resetting of a portion of the integrated circuit when this portion is supplied by a voltage that is normally insufficient for the resetting for example comprised between 0.66V and 0.9V.

BRIEF SUMMARY

In an embodiment, an integrated circuit comprises a first portion and a second portion. The first portion comprises a reset input configured to receive a reset signal, an activation module connected to the reset input. The activation module is configured to activate the second portion upon reception of the reset signal. The first portion comprises an emissions module configured to emit a replicated reset signal. The second portion can be selectively activated or deactivated. The second portion comprises a reset input configured to receive the replicated reset signal of the emissions module, a determination module configured to determine that an elapsed time starting from the activation of the second portion of the circuit oversteps a threshold. The integrated circuit is such that the emissions module is configured to emit the replicated reset signal upon reception of the reset signal, the emissions module is configured to stop the emission of the replicated reset signal when the threshold is overstepped.

The integrated circuit, according to a first aspect of the disclosure facilitates resetting of the second portion, even if the reset signal was received during the period when the second portion is on standby. Indeed, following the reception of a reset signal, the first portion activates the second portion. Following this activation the first portion emits a replicated reset signal. This emission is carried out sufficiently long enough so that the second portion is able to be activated and is in a state allowing for the resetting thereof at the moment of the emission of the replicated reset signal.

In an embodiment the emissions module comprises a flip-flop. The flip-flop is configured to be selectively in a stored state or in an erased state. The flip-flop comprises a clock input, connected to the reset input of the first portion, a data input receiving an active signal, an erasure input, connected to an output of the determination module. The determination module is configured to emit on its output an overstepping signal when the threshold is overstepped. The flip-flop is configured to switch to the stored state, upon reception of an edge of the reset signal, an output of the flip-flop is configured to emit an active state signal when the flip-flop is in the stored state. The flip-flop is configured to switch to the erased state, when the overstepping signal is active. The output of the flip-flop is configured to emit an inactive state signal when the flip-flop is in the erased state.

In an embodiment the emissions module comprises a logic gate. The logic gate comprises a first input configured to receive the state signal of the output of the flip-flop, a second input configured to receive the reset signal, an output connected to the output of the emissions module and configured to emit the replicated reset signal. The logic gate is configured so that the replicated reset signal is active if the state signal is active or if the reset signal is active.

In an embodiment the second portion comprises a clock configured to emit a clock signal when the second portion is active. The determination module comprises a first flip-flop and a second flip-flop. The first flip-flop comprises a clock input configured to receive the clock signal, a data input configured to receive an inactive signal, an output configured to emit an intermediate output signal. The first flip-flop is configured so that, following a first edge of the clock signal, the intermediate output signal switches to an active state. The second flip-flop comprises a clock input configured to receive the clock signal, a data input connected to the output of the first flip-flop, an output, connected to the output of the determination module and configured to emit the overstepping signal. The second flip-flop is configured so that, following a second edge of the clock signal subsequent to the first edge, the overstepping signal switches to an active state.

In an embodiment the integrated circuit comprises a first logic gate comprising an input connected to the output of the emissions module of the first portion, an output connected to the reset input of the second portion, a control input connected to an isolation output of the activation module. The integrated circuit comprises a second logic gate comprising an input connected to the overstepping output of the determination module, an output connected to an overstepping input of the emissions module of the first portion, a control input connected to the isolation output of the activation module. The activation module is configured to emit an isolation signal on its isolation output. The first logic gate is configured to be on upon reception of the isolation signal on its control input. The second logic gate is configured to be on upon reception of an isolation signal on its control input.

According to another aspect a method for resetting of a second portion of an integrated circuit by a first portion of an integrated circuit is proposed. The method comprises the following steps:

- reception of a reset signal by the first portion (PART1);
- activation of the second portion;
- emission of a replicated reset signal by the first portion to the second portion;
- determination that an elapsed time since the activation of the second portion has overstepped a threshold; and
- stoppage of the emission of the replicated reset signal when the elapsed time since the activation of the second portion has overstepped the threshold.

In an embodiment the method for resetting comprises a step of electrical connection between the first portion and the second portion. The connection step is carried out between the activation step and the emission step.

According to another aspect an integrated circuit comprising a first portion and a second portion is proposed. The first portion is configured for the implementing of the method for resetting of the preceding paragraphs.

In an embodiment, an integrated circuit comprises: first circuitry; and second circuitry coupled to the first circuitry, wherein the first circuitry, in operation, responds to a reset signal by: generating an activation signal; and generating a replicated reset signal; and the second circuitry, in operation: activates in response to the activation signal; resets in response to the replicated reset signal; and generates an indication of whether a threshold period of time has elapsed since the activation of the second circuitry, wherein the first circuitry, in operation, disables the replicated reset signal in response to the generated indication indicating the threshold period of time has elapsed.

In an embodiment, a method comprises: responding to a reset signal by generating an activation signal using first circuitry of an integrated circuit; generating, using the first circuitry, a replicated reset signal; activating second circuitry of the integrated circuit in response to the activation signal; resetting the second circuitry in response to the replicated reset signal; generating, by the second circuitry, an indication of whether a threshold period of time has elapsed since the activation of the second circuitry; and disabling, by the first circuitry, of the replicated reset signal in response to the generated indication indicating the threshold period of time has elapsed.

In an embodiment, a system, comprises: a master circuit, which, in operation, generates reset signals; and an integrated circuit coupled to the master circuit, the integrated circuit including activation circuitry and functional circuitry coupled to the activation circuitry, wherein the integrated circuit, in operation: responds to a reset signal received from the master circuit by generating an activation signal using the activation circuitry; generates, using the activation circuitry, a replicated reset signal; activates the functional circuitry of the integrated circuit in response to the activation signal; resets the functional circuitry of the integrated circuit in response to the replicated reset signal; generates, using the functional circuitry, an indication of whether a threshold period of time has elapsed since the activation of the functional circuitry; and discontinues the replicated reset signal in response to the generated indication indicating the threshold period of time has elapsed.

In an embodiment, a non-transitory computer-readable medium's contents configure an integrated circuit to perform a method, the method comprising: responding to a reset signal by generating an activation signal; generating a replicated reset signal; activating functional circuitry of the integrated circuit in response to the activation signal; resetting the functional circuitry in response to the replicated reset signal; generating an indication of whether a threshold period of time has elapsed since the activation of the functional circuitry; and disabling of the replicated reset signal in response to the generated indication indicating the threshold period of time has elapsed.

BRIEF DESCRIPTION OF THE SEVERAL VIEWS OF THE DRAWINGS

Other characteristics, purposes and advantages of the disclosure shall come from the following description, which is purely for the purposes of illustration and is not limiting and which must be read with regards to the accompanying drawings wherein.

DETAILED DESCRIPTION

Figure 1:
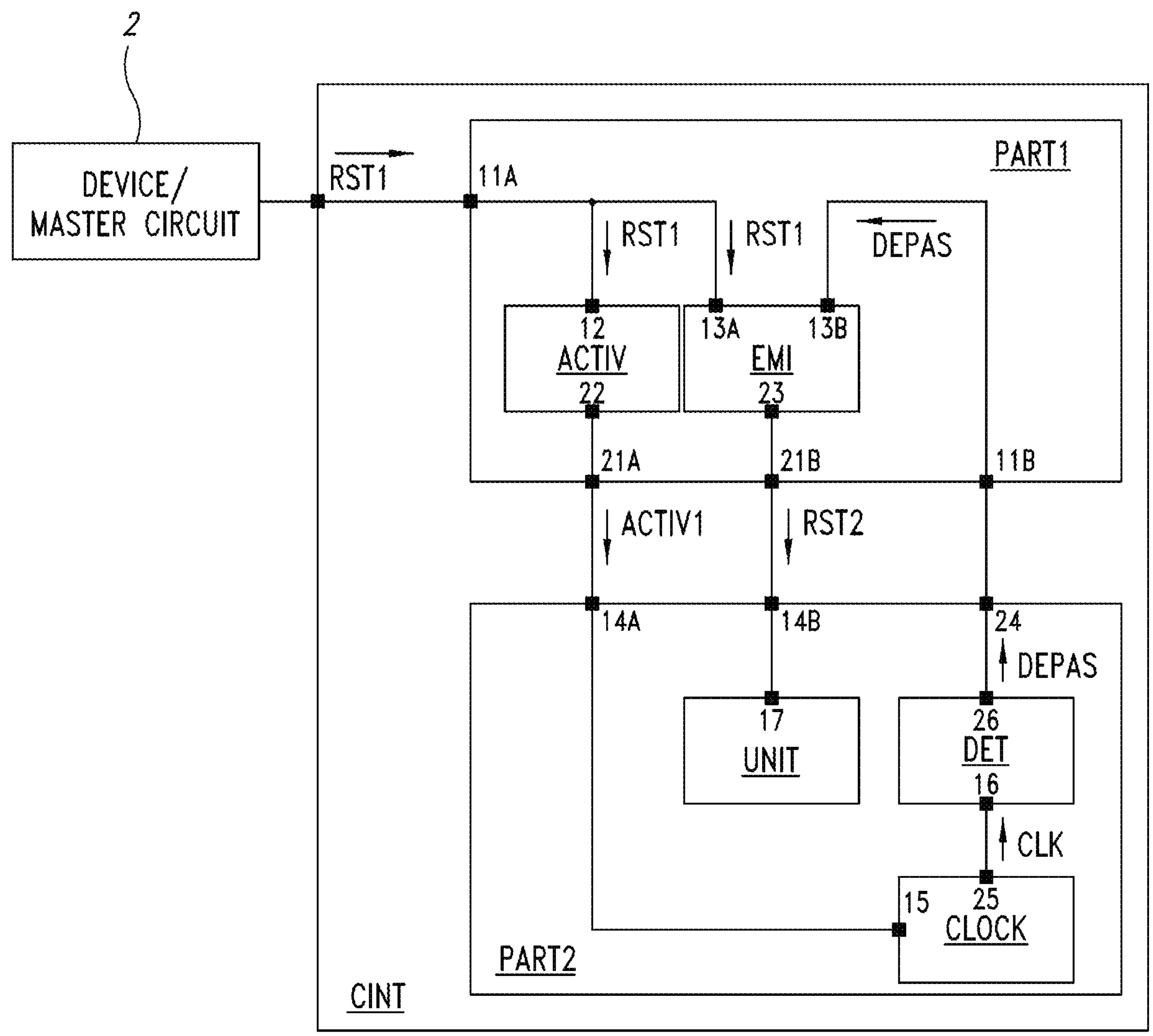
FIG. 1 diagrammatically shows an integrated circuit according to an embodiment of the disclosure.

FIG. 1 diagrammatically shows an integrated circuit CINT according to an embodiment of the disclosure.

It is specified that in the figures the solid squares represent an input or an output and the solid circles represent an electrical connection between two wires or lines.

In what follows the inputs are indicated by a reference that begins with the digit 1 and the outputs by a reference that begins with the digit 2.

The integrated circuit CINT comprises a first portion or circuitry PART1 and a second portion or circuitry PART2.

The second portion PART2 can selectively have two operating modes:

- an active operating mode, and
- a standby operating mode.

A supply voltage of the second portion PART2, when it is on standby, is generally 0.6V. The supply voltage of the second portion PART2, when it is active, is generally 0.9V.

The supply voltage of the first portion PART1, when it is on standby, is generally 3.0V.

The second portion PART2 is said to be activated when its supply voltage is modified in order to switch it from the standby operating voltage to the active operating voltage.

The first portion PART1 and the second portion PART2 each comprise several modules or circuits. These modules exchange logic signals between them. Each logic signal is represented by an electric signal that can have two levels, a high level ("H") and a low level ("L"). The voltage of the high level is greater than the voltage of the low level. The switching of the electric signal from the low level to the high level is called rising edge. The switching of the electric signal from the high level to the low level is called falling edge.

An active level is defined as being the level that makes it possible to carry out the function allocated to the signal. In an embodiment, the low level (L) may be arbitrarily chosen as the active level. It is then said that the signal is active. If the signal is on the other level (H) the signal is said to be inactive. Likewise an active edge is defined as being the edge, or the transition, of a signal that triggers the function allocated to the signal. In other embodiments, the high level may be the active level.

In the following description the rising edge is arbitrarily chosen as the active edge of the clock signal. In other embodiments, the falling edge may be the active edge of the clock signal. By simplification it is said that a signal is received when this signal is received at an active level, a signal is said to be emitted when it is emitted at an active level, it is said that a signal is not received when it is received at an inactive level and it is said that it is not emitted or that the emission of the signal is stopped when it is emitted at the inactive level.

The first portion PART1 comprises an input 11A (reset input) receiving a reset signal RST1. It is considered that this reset signal RST1 has for high level 3.0V and for low level 0V. The reset input 11A may generally be electrically connected to another device, such as a third-party device 2 and receives the reset signal RST1 of this third-party device. This third-party device is for example a push-button used for the resetting of the integrated circuit CINT or another "master" circuit used for the emission of the reset signal RST1.

Conventionally it can be a simple push-button used for emergency resetting or this signal can be controlled by another "master" circuit in the application.

The first portion PART1 comprises an output 21A configured to emit an activation signal ACTIV1, described hereinafter, to the second portion PART2.

The first portion PART1 comprises an output 21B configured to emit a replicated reset signal RST2, described hereinafter, to the second portion PART2. It is considered that this replicated reset signal RST2 has for high level 0.9V and for low level 0V, when the second portion PART2 is in active operating mode. It is considered that this replicated reset signal RST2 has for high level 0.66V and for low level 0V, when the second portion PART2 is in standby operating mode.

Generally the resetting is carried out when the reset signal RST1 has a low level (L), the active level of the reset signal is therefore the low level.

The first portion PART1 comprises an input 11B configured to receive an overstepping signal DEPAS, described hereinafter, of the second portion PART2.

The first portion PART1 comprises an activation module or circuit ACTIV configured to activate the second portion PART2. The activation module ACTIV comprises an input 12 electrically connected to the reset input 11A and an output 22 connected to the output 21A of the first portion PART1 to supply the activation signal ACTIV1 to the second portion PART2. The activation module ACTIV is then configured to activate the second portion PART2 of the integrated circuit CINT when the reset signal has a low level by sending the activation signal ACTIV1.

The activation module ACTIV can also be configured to control the increase of an electrical voltage supplying the second portion PART2 when the reset signal RST1 has a low level.

The first portion PART1 comprises an emissions module or circuit EMI configured to emit the replicated reset signal RST2. The emissions module EMI comprises an input 13A (reset input) coupled to the input 11A to receive the signal RST1. The emissions module EMI comprises an input 13B (overstepping input) coupled to the input 11B, to receive the overstepping signal DEPAS of the second portion PART2. The emissions module EMI comprises an output 23, connected to the output 21B of the first portion PART1, emitting the replicated reset signal RST2.

The emissions module EMI is configured to emit the replicated reset signal RST2 at the low level (active level) upon reception of the reset signal RST1 and to emit the replicated reset signal RST2 at the high level (inactive level) upon reception of the overstepping signal DEPAS.

The second portion PART2 comprises a clock CLK, a determination module or circuit DET and a processing module or circuit UNIT of the processor type.

The second portion PART2 comprises an input 14A (activation input) to receive the activation signal ACTIV1 and an input 14B (reset input) to receive the replicated reset signal RST2. The second portion PART2 comprises an output 24 via which the overstepping signal DEPAS is emitted. The output 24 is connected to the input 11B of the first portion PART1, connected to the input 13B of the emissions module EMI, in order to allow the reception of the overstepping signal DEPAS by the emissions module EMI.

The processing module UNIT comprises an input 17 (reset input). The input 17 is connected to the input 14B of the second portion PART2, connected to the output 21B of the first portion PART1, connected to the output 23 of the emissions module EMI, to receive the replicated reset signal RST2. The processing module UNIT of the second portion PART2 is then configured to be reset when the replicated reset signal RST2 is of the low level (active level).

The clock CLK comprises an input 15 connected to the input 14A of the second portion PART2 receiving the activation signal ACTIV1 of the first portion PART1 and an output 25 on which it emits a clock signal CLK. The clock signal CLK is an oscillating electric signal, that provides a clock signal of the second portion PART2 of the circuit.

Generally the oscillating electric signal is of the slot or pulse type and has a succession of rising then falling edges. A period of the oscillating electric signal is called clock cycle. The clock CLOCK is off when the second portion PART2 is on standby and does not emit the clock signal CLK. The clock CLOCK is on when the second portion PART2 is active. When the clock CLOCK receives on its input 15 the activation signal ACTIV1 it emits the clock signal CLK.

The determination module or circuit DET comprises an input 16 and an output 26. It receives the clock signal CLK on its input 16 and is configured to count a number of edges (rising or falling) of the clock signal CLK. The elapsed time oversteps the temporal threshold when the number of edges oversteps an edge threshold, such as two edges.

The determination module DET thus determines that an elapsed time since the activation of the second portion PART2 oversteps a temporal threshold and emits the overstepping signal DEPAS on its output 26 following this overstepping.

The determination module DET is electrically connected to the first portion PART1. More particularly the output 26 of the determination module DET is electrically connected to an output 24 of the second portion PART2, connected to an input 11B of the first portion PART1, to transmit the overstepping signal DEPAS to the emissions module EMI.

Consequently, when the emissions module EMI receives the overstepping signal DEPAS, the emissions module EMI stops the emission of the replicated reset signal RST2 by switching the level of this signal to a high level (inactive level). In an embodiment, it is generally considered that the overstepping signal DEPAS is received when the overstepping signal has a high level.

The second portion PART2 can also comprise another internal circuit (not shown in FIG. 1) connected to the input 14A and configured to receive the activation signal ACTIV1.

Figure 2:
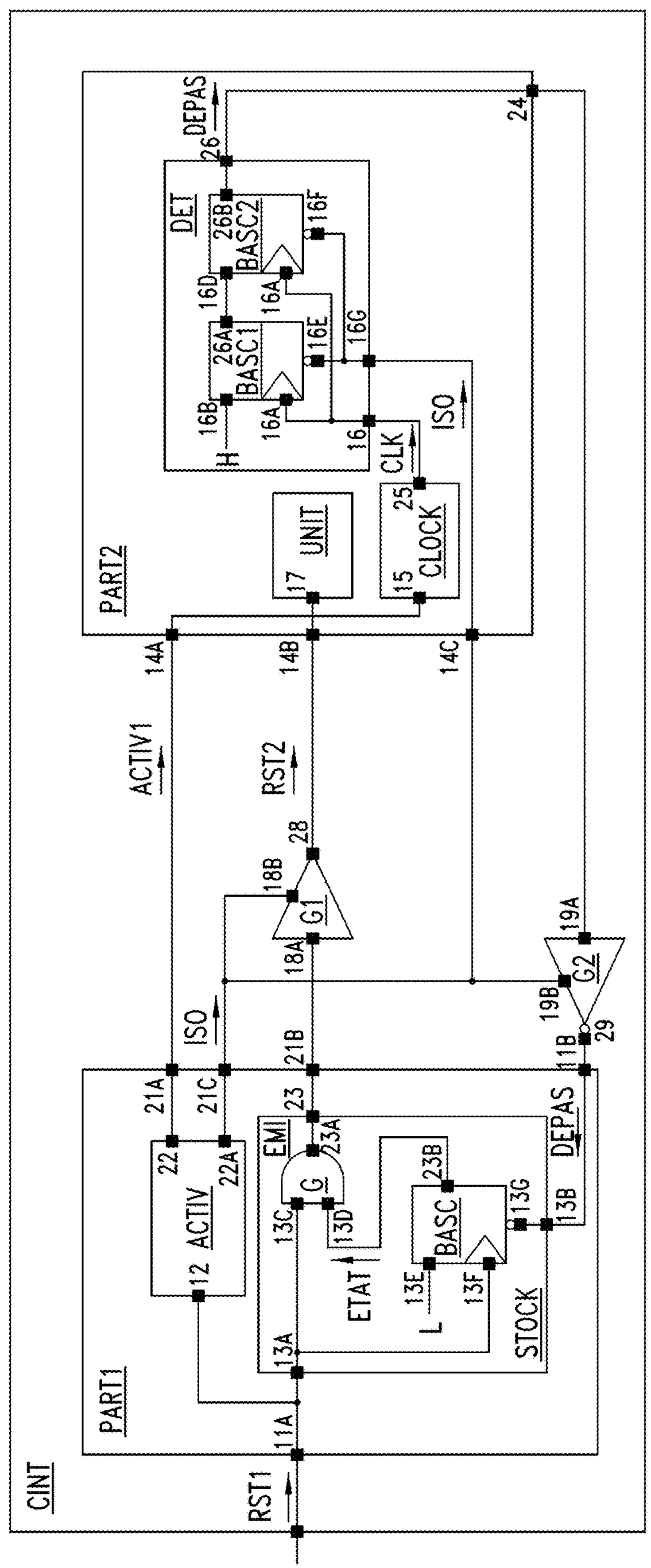
FIG. 2 diagrammatically shows an integrated circuit according to another embodiment of the disclosure.

FIG. 2 shows the integrated circuit CINT in a more detailed manner.

As described in relation with FIG. 1, the integrated circuit CINT comprises a first portion or circuitry PART1, a second portion or circuitry PART2, and modules or circuits ACTIV, EMI, DET, CLOCK and UNIT.

The emissions module EMI comprises a logic gate G of the "logic AND" type and a flip-flop BASC.

The flip-flop BASC is a logic circuit. The flip-flop BASC comprises an input 13F (clock input) connected to the input 13A of the emissions module EMI, connected to the input 11A of the first portion PART1, to receive the reset signal RST1. The flip-flop BASC comprises an input 13G (erasure input) connected to the input 13B of the emissions module EMI, connected to the input 11B of the first portion PART1, to receive the overstepping signal DEPAS. The flip-flop BASC comprises an input 13E (data input) to receive a signal at the low state L. The flip-flop BASC finally comprises an output 23B to supply a state signal ETAT.

The state signal ETAT varies following the reception of a falling edge of the reset signal RST1 (received on the clock input of the flip-flop). At the moment of the falling edge the level of the state signal ETAT takes the level of the signal received on the data input. Then the level of the state signal ETAT is not modified as long as there is not again a falling edge of the reset signal RST1. The data input is at a low level, therefore following the appearance of a falling edge on the signal of the clock input, the state signal ETAT switches to a low level. The erasure input 13G allows for the erasing of the flip-flop BASC. When a low level signal is applied on the erasure input 13G of the flip-flop BASC the signal emitted on the output 23B of the flip-flop BASC is put back to a high level.

It is considered that when the output 23B of the flip-flop BASC emits a low level signal L, the flip-flop BASC is in a stored state and when the output 23B of the flip-flop BASC emits a high level signal H, the flip-flop BASC is in an erased state.

The logic gate G comprises a first input 13C, connected to the input 13A of the emissions module EMI, to receive the reset signal RST1. The logic gate G comprises a second input 13D connected to the output 23B of the flip-flop BASC. The logic gate G comprises an output 23A connected to the output 23 of the emissions module EMI, to emit the replicated reset signal RST2.

The replicated reset signal RST2 emitted on the output 23A of the logic gate G is at a high level as long as the first input 13C and the second input 13D receive a high level signal. The replicated reset signal RST2 emitted on the output 23A is at a low level if the first input 13C or the second input 13D receive a low level signal.

Thus, considering that the low level is the active level, when the reset signal RST1 is active or the state signal ETAT is active, then the replicated reset signal RST2 is active.

In an embodiment where the high level is the active level for the reset signal RST1, the logic gate G is a gate of the "logic OR" type so that, when the reset signal RST1 is active (high level) or the state signal ETAT is active (high level), then the replicated reset signal RST2 is active (high level).

The determination module DET comprises a first flip-flop BASC1 and a second flip-flop BASC2.

The first flip-flop BASC1 is a logic circuit. The first flip-flop BASC1 comprises an input 16A (clock input) connected to the input 16 of the determination module DET, connected to the output 25 of the clock CLOCK, to receive the clock signal CLK. The first flip-flop BASC1 comprises an input 16B (data input) receiving a high level signal (therefore an inactive signal). The first flip-flop BASC1 comprises an output 26A to emit an intermediate output signal.

The second flip-flop BASC2 is a logic circuit. The second flip-flop BASC2 comprises an input 16C (clock input) connected to the input 16 of the determination module DET, to receive the clock signal CLK. The second flip-flop BASC2 comprises an input 16D (data input) connected to the output 26A of the first flip-flop BASC1 to receive the intermediate output signal. The second flip-flop BASC2 comprises an output 26B connected to the output 26 determination module DET to emit the overstepping signal DEPAS.

Thus, following the activation of the second portion PART2 and the restarting of the clock CLOCK of the second portion PART2, the first falling edge appearing on the clock signal CLK received on the input 16A of the first flip-flop BASC1 switches the level of the intermediate output signal emitted on the output 26A of the first flip-flop BASC1 from a low level to a high level. The second falling edge appearing on the clock signal CLK received on the input 16C of the second flip-flop BASC2 switches the level of the overstepping signal DEPAS emitted on the output 26B of the second flip-flop BASC2 from a low level to a high level. This overstepping signal DEPAS is then inverted at the output 29 of logic gate G2 in order to obtain a low level on the erasure input 13G of the flip-flop BASC. The reception of the overstepping signal DEPAS of low level, causes the switching of the flip-flop BASC, of the emissions module EMI, to the erased state. This switching causes the stoppage of the emission of the replicated reset signal RST2 by the emissions module EMI.

The integrated circuit CINT of FIG. 2 differs from the one of FIG. 1 in that the output 21B of the first portion PART1 and the input 14B of the second portion PART2 are selectively connected or electrically isolated from one another by an interposed logic gate G1.

Likewise, the output 24 of the second portion PART2 and the input 11B of the first portion PART1 are selectively connected or electrically isolated from one another by an interposed logic gate G2.

The logic gate G1 is a gate of the follower type that has an output selectively connected to or electrically isolated from an input.

The logic gate G2 is a gate of the inverter follower type that has an output selectively connected to or electrically isolated from an input. In addition this logic gate inverts the level of the signal emitted on the output with respect to the signal received on the input. Thus if the logic gate G2 receives a high level signal H it emits a low level signal L and if the logic gate G2 receives a low level signal L it emits a high level signal H.

The logic gate G1 comprises an input 18A connected to the output 21B of the first portion PART1 and an output 28 connected to the input 14B of the second portion PART2. The logic gate G1 comprises an input 18B (control input) receiving an isolation signal ISO, described hereinafter. The isolation signal ISO controls the logic gate G2 so that its input 18A and its output 28 are connected or isolated.

Likewise, the logic gate G2 comprises an input 19A connected to the output 24 of the first portion PART1 and an output 29 connected to the input 11B of the second portion PART2. The logic gate G2 comprises an input 19B (control input) receiving the isolation signal ISO. The isolation signal ISO controls the logic gate G2 so that its input 19A and its output 29 are connected or isolated.

In the case where the logic gates G1 and G2 are present, the activation module ACTIV further comprises an output 22A (isolation output), connected to an output 21C of the first portion PART1, connected to the inputs 18B and 19B of respectively the logic gate G1 and the logic gate G2, to supply the isolation signal ISO that makes it possible to control the logic gates G1 and G2. The isolation signal ISO is active as long as the supply voltage of the second portion PART2 is less than a value that guarantees the complete functionality of the second portion PART2, for example, 0.81V. The goal is to ensure that as long as the supply voltage of the second portion PART2 is less than 0.81V:

The input 14B of the second portion PART2 receives a signal having a static level. Indeed a signal that varies on the output 21B of the first portion PART1 is not transmitted due to the first logic gate G1. Indeed at a voltage lower than 0.81V it would not be possible to guarantee the effect in the domain Part2 of a dynamic activity on the reset signal, only the memory function may be provided.

The input 11B of the first portion PART1 receives a signal having a static level. Indeed a signal that varies on the output 24 of the second portion PART2 is not transmitted due to the second logic gate G2. The transmission of a signal from the first portion PART1 to the second portion PART2 is all the more so complex to carry out that the difference between the supply voltages of the first portion PART1 and the second portion PART2 are high. In particular it is possible to provide the transmission of a signal of the second portion PART2 to the first portion PART1 only if the supply voltage of the second portion PART2 is greater than 0.81V.

In an embodiment the logic gate G1 is configured to connect its input 18A and its output 28 when the isolation signal ISO received on the control input 18B has a low level L. The logic gate G1 is configured to isolate its input 18A and its output 28 when the isolation signal ISO received on the control input 18B has a high level H.

Likewise, the logic gate G2 is configured to connect its input 19A and its output 29 when the isolation signal ISO received on the control input 19B has a low level L. The logic gate G2 is configured to isolate its input 19A and its output 29 when the isolation signal ISO received on the control input 18B has a high level H.

Thus, when the isolation signal ISO has a high level H, the replicated reset signal RST2 and the overstepping signal DEPAS are not transmitted between the first portion PART1 and the second portion PART2.

The first flip-flop BASC1 of the determination module DET can comprise an input 16E (erasure input), connected to an input 16G of the determination module DET, connected to an input 14C of the second portion PART 2, connected to the output 21C of the first portion PART1, to receive the isolation signal ISO.

Likewise the second flip-flop BASC2 can comprise an input 16F (erasure input), connected to the input 16G of the determination module DET, to receive the isolation signal ISO.

The reception of a high level isolation signal ISO on the input 16E of the first flip-flop BASC1 causes the erasure of the first flip-flop BASC1 and the switching to a low level of the signal emitted on the output 26A of the first flip-flop BASC1. Likewise, the reception of a high level isolation signal ISO on the input 16F of the second flip-flop BASC2 causes the erasure of the second flip-flop BASC2 and the switching to a low level of the signal emitted on the output 26B of the second flip-flop BASC2.

Thus following the emission of a high level isolation signal, controlling the stoppage of the isolation between the first portion PART1 and the second portion PART2, the flip-flops BASC1 and BASC2 of the determination module DET are reset in anticipation of a future reception cycle of a replicated reset signal RST2.

Figure 3:
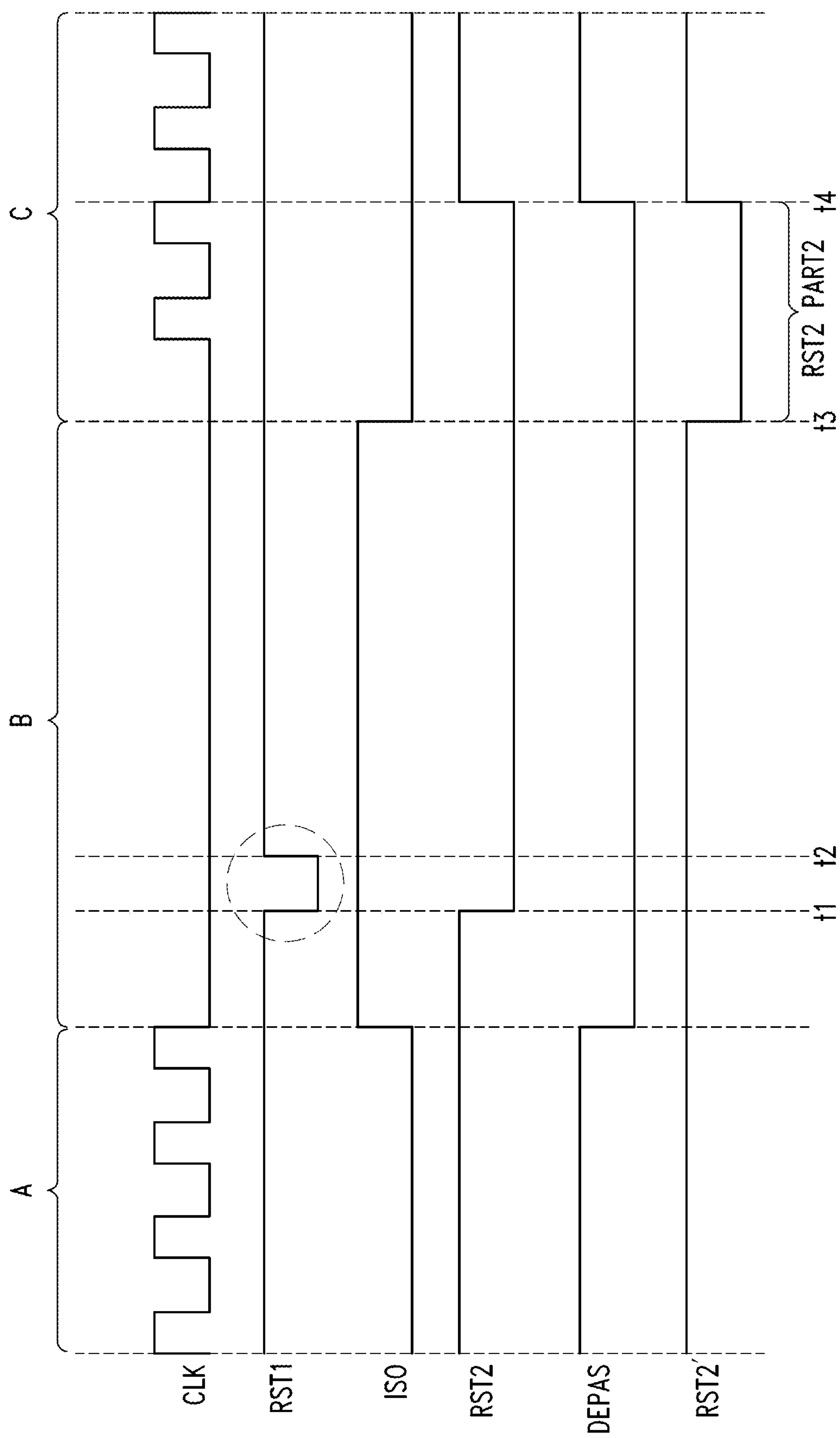
FIG. 3 shows a temporal diagram of the various signals exchanged between the various elements of the integrated circuit according to an embodiment of the disclosure.

FIG. 3 shows a temporal diagram of the various signals exchanged between the various elements of the integrated circuit CINT described in FIG. 2.

The diagram is divided into three sections (from left to right), a section A wherein the second portion PART2 is active, a section B wherein the second portion PART2 is on standby, and a section C wherein the second portion PART2 is reactivated.

Starting from the top, the signals shown are as follows:

- The signal of the clock CLK of the second portion PART2, this clock signal CLK is at first active (section A), then this signal is inactive (section B), finally this signal becomes active again (section C) following the reactivation of the second portion PART2.
- The reset signal RST1, this signal is received between two temporal instants t1 and t2 at a moment when the second portion PART2 is inactive (section B). Between these two temporal instants the first portion PART1 is isolated from the second portion PART2, the second portion PART2 is on standby and the duration of the reset signal RST1 is less than the duration required for the reactivation of the second portion PART2. Thus the second portion PART2 cannot be reset using this reset signal RST1.
- The isolation signal ISO, this signal is set to the high state H by the activation module ACTIV when the second portion PART2 is on standby (section B), so as to electrically isolate the first portion PART1 and the second portion PART2.
- The replicated reset signal RST2, this signal is emitted by the emissions module EMI following reception of the reset signal RST1 (starting from temporal instant t1) and until two edges of the clock of the second portion PART2 have been received (until temporal instant t4). Thus the replicated reset signal RST2 is emitted, in the temporal interval comprised between temporal instants t1 and t4 so as to make possible; the activation of the second portion PART2 (starting at temporal instant t3) and the reception of the replicated reset signal RST2 by the second portion PART2 when it is reactivated.
- The overstepping signal DEPAS, this signal is emitted when two edges of the clock of the second portion PART2 have been received. Following the reception of this overstepping signal, at temporal instant t4, the emissions module EMI stops the emission of the replicated reset signal.
- The replicated reset signal RST2' such as received by the second portion PART2. The logic gate G1 is in isolated mode until temporal instant t3 marking the beginning of the activation of the second portion PART2. Thus the replicated reset signal RST2 emitted on the output 21B of the first portion PART1 is not received, due to the isolation of the logic gate G1, on the input 14B of the second portion PART2, during the temporal interval comprised between t1 and t3. This replicated reset signal RST2 is received by the second portion PART2 starting from temporal instant t3 (marking the end of the isolation between the first portion PART1 and the second portion PART2) and until temporal instant t4 (marking the end of the emission of the replicated reset signal RST2).

Figure 4:
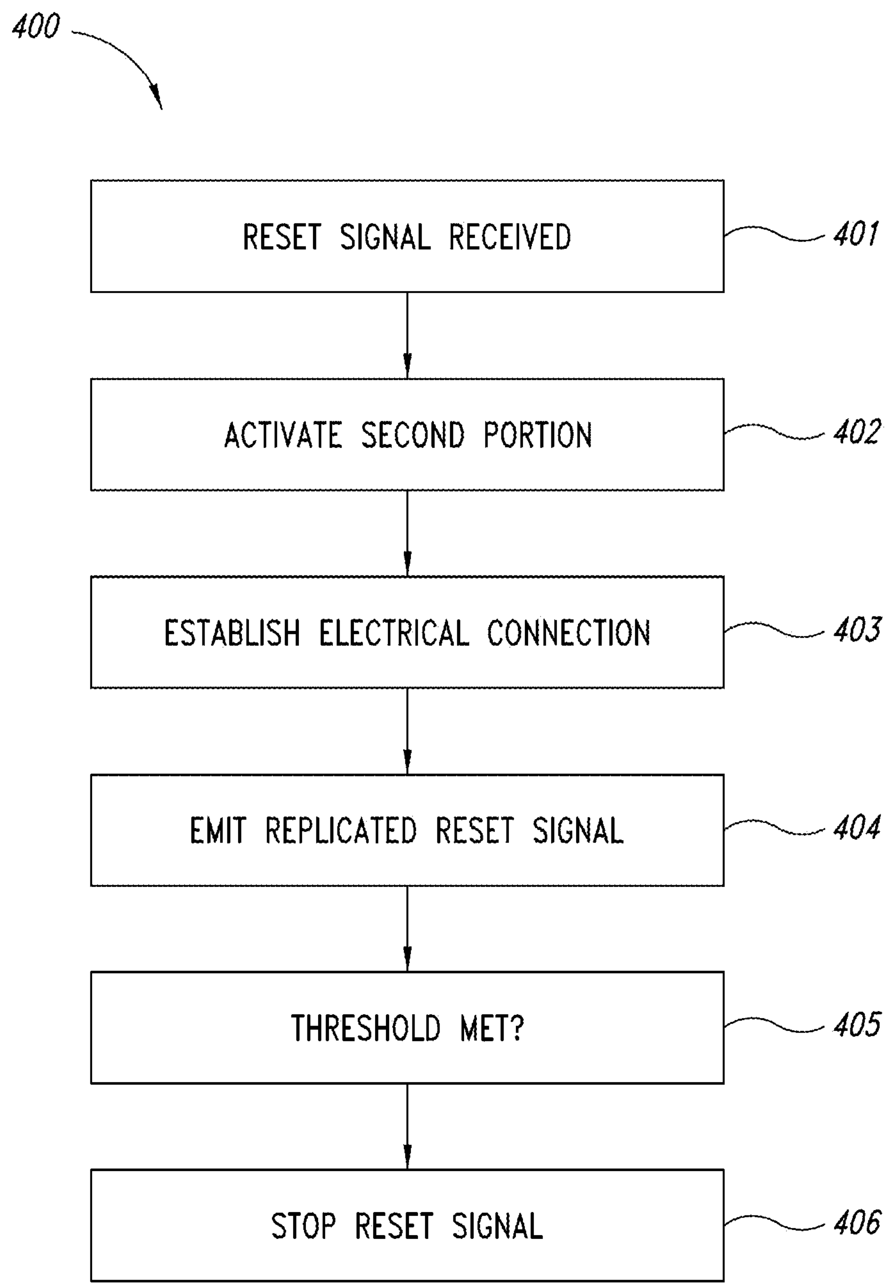
FIG. 4 shows a method for resetting according to an embodiment of the disclosure.

FIG. 4 shows a method 400 for resetting according to an aspect of the disclosure.

More particularly, the method 400 is a method for resetting the second portion PART2 of the integrated circuit CINT by the first portion PART1 of the integrated circuit CINT.

This method comprises the following steps 401 to 406:

Step 401—the reception of the reset signal RST1 by the first portion PART1;

Step 402—the activation of the second portion PART2;

Step 403—the electrical connection between the first portion PART1 and the second portion PART2;

Step 404—the emission of a replicated reset signal RST2 by the first portion PART1 to the second portion PART2;

Step 405—the determination than an elapsed time since the activation of the second portion PART2 has overstepped a threshold; and Step 406—the stoppage of the emission of the replicated reset signal RST2 when the elapsed time since the activation of the second portion PART2 has overstepped the threshold.

If the first portion PART1, and the second portion PART2 are electrically connected permanently together, the connection step 403 is not necessary.

Example embodiments are described below, and include example references to the figures.

Integrated circuit (CINT) may be summarized as including a first portion (PART1) and a second portion (PART2); the first portion (PART1) comprising a reset input (11A) configured to receive a reset signal (RST1), an activation module (ACTIV) connected to the reset input (11A), the activation module (ACTIV) being configured to activate the second portion (PART2) upon reception of the reset signal, an emissions module (EMI) configured to emit a replicated reset signal (RST2); the second portion (PART2) able to be selectively activated or deactivated, the second portion (PART2) comprising a reset input (14B) configured to receive the replicated reset signal (RST2) of the emissions module (EMI), a determination module (DET) configured to determine that an elapsed time starting from the activation of the second portion of the circuit oversteps a threshold; the integrated circuit (CINT) being such that the emissions module (EMI) is configured to emit the replicated reset signal (RST2) upon reception of the reset signal (RST), the emissions module (EMI) is configured to stop the emission of the replicated reset signal (RST2) when the threshold is overstepped.

The emissions module (EMI) may include a flip-flop (BASC); the flip-flop (BASC) being configured to be selectively in a stored state or in an erased state, the flip-flop (BASC) comprising: a clock input (13F), connected to the reset input (11A) of the first portion (PART1), a data input (13E) receiving an active signal, an erasure input (13G), connected to an output (26) of the determination module (DET); the determination module (DET) being configured to emit on its output (26) an overstepping signal (DEPAS) when the threshold is overstepped; the flip-flop (BASC) being configured to switch to the stored state, upon reception of an edge of the reset signal (RST), an output (23B) of the flip-flop (BASC) being configured to emit an active state signal (ETAT) when the flip-flop (BASC) is in the stored state; the flip-flop (BASC) being configured to switch to the erased state, when the overstepping signal (DEPAS) is active, the output (23B) of the flip-flop (BASC) being configured to emit an inactive state signal (ETAT) when the flip-flop (BASC) is in the erased state.

The emissions module (EMI) may include a logic gate (G); the logic gate (G) comprising: a first input (13D) configured to receive the state signal (ETAT) of the output (23B) of the flip-flop (BASC), a second input (13C) configured to receive the reset signal (RST), an output (23A) connected to the output (23) of the emissions module (EMI) and configured to emit the replicated reset signal (RST2); the logic gate (G) being configured so that the replicated reset signal (RST2) is active if the state signal (ETAT) is active or if the reset signal (RST) is active.

The second portion (PART2) may include a clock (CLOCK) configured to emit a clock signal (CLK) when the second portion (PART2) is active; the determination module (DET) comprising a first flip-flop (BASC1) and a second flip-flop (BASC2); the first flip-flop (BASC1) comprising: a clock input (16*a*) configured to receive the clock signal (CLK), a data input (16B) configured to receive an inactive signal, an output (26A) configured to emit an intermediate output signal; the first flip-flop (BASC1) being configured so that, following a first edge of the clock signal (CLK), the intermediate output signal switches to an active state; the second flip-flop (BASC2) comprising: a clock input (16C) configured to receive the clock signal (CLK), a data input (16D) connected to the output (26A) of the first flip-flop (BASC1), an output (26B), connected to the output (26) of the determination module (DET) and configured to emit the overstepping signal (DEPAS); the second flip-flop (BASC2) being configured so that, following a second edge of the clock signal (CLK) subsequent to the first edge, the overstepping signal (DEPAS) switches to an active state.

Integrated circuit may include a first logic gate (G1) including: an input (18A) connected to the output (23) of the emissions module (EMI) of the first portion (PART1), an output (28) connected to the reset input (14B) of the second portion (PART2), a control input (18B) connected to an isolation output (22A) of the activation module (ACTIV); a second logic gate (G2) including: an input (19A) connected to the overstepping output (26) of the determination module (DET), an output (29) connected to an overstepping input (13B) of the emissions module (EMI) of the first portion (PART1), a control input (19B) connected to the isolation output (22A) of the activation module (ACTIV); the activation module (ACTIV) being configured to emit an isolation signal (ISO) on its isolation output (22A); the first logic gate (G1) being configured to be on upon reception of the isolation signal (ISO) on its control input (18B); the second logic gate (G2) being configured to be on upon reception of an isolation signal (ISO) on its control input (19B).

Method for resetting a second portion (PART1) of an integrated circuit (CINT) by a first portion (PART1) of the integrated circuit (CINT), the method may be summarized as including the following steps: reception (401) of a reset signal (RST) by the first portion (PART1), activation (402) of the second portion (PART2), emission (404) of a replicated reset signal (RST2) by the first portion (PART1) to the second portion (PART2), determination (405) that an elapsed time since the activation of the second portion (PART2) has overstepped a threshold, stoppage (406) of the emission of the replicated reset signal (RST2) when the elapsed time since the activation of the second portion (PART2) has overstepped the threshold.

Method for resetting may further include a step of electrical connection (403) between the first portion (PART1) and the second portion (PART2); the connection step (403) being carried out between the activation step (402) and the emission step (404).

Integrated circuit (CINT) may be summarized as including a first portion (PART1) and a second portion (PART2), the first portion (PART1) being configured for the implementing of the method of resetting.

Computer program product may be summarized as including program code instructions that, when they are executed by an integrated circuit (CINT), allow for the implementation of the method for resetting.

In an embodiment, an integrated circuit comprises: first circuitry; and second circuitry coupled to the first circuitry, wherein the first circuitry, in operation, responds to a reset signal by: generating an activation signal; and generating a replicated reset signal; and the second circuitry, in operation: activates in response to the activation signal; resets in response to the replicated reset signal; and generates an indication of whether a threshold period of time has elapsed since the activation of the second circuitry, wherein the first circuitry, in operation, disables the replicated reset signal in response to the generated indication indicating the threshold period of time has elapsed. In an embodiment, the first circuitry comprises a flip-flop, the flip-flop including: a clock input, which, in operation, receives the reset signal; a data input, which, in operation, receives an active signal; and an erasure input, which, in operation, receives the generated indication of whether the threshold period of time has elapsed, wherein the flip-flop, in operation: switches to a stored state of operation and emits an active state signal at an output of the flip-flop in response to reception of an edge of the reset signal; and switches to an erased state of operation and emits an inactive state signal at the output of the flip-flop in response to the generated indication indicating the threshold period of time has elapsed. In an embodiment, the first circuitry comprises a logic gate having: a first input coupled to the output of the flip-flop; a second input, which, in operation, receives the reset signal; and an output, which, in operation, emits the replicated reset signal, wherein the replicated reset signal is active if the state signal is active or if the reset signal is active. In an embodiment, wherein the second circuitry comprises: a clock, which, in operation, generates a clock signal when the second circuitry is active; a first flip-flop comprising: a clock input, which, in operation, receives the clock signal; a data input, which, in operation, receives an inactive signal; and an output, which, in operation, emits an intermediate output signal, wherein the first flip-flop, in operation, switches the intermediate output signal to an active state in response to a first edge of the clock signal; and a second flip-flop comprising: a clock input, which, in operation, receives the clock signal; a data input connected to the output of the first flip-flop; and an output, which, in operation, emits the generated indication of whether a threshold period of time has elapsed since the activation of the second circuitry, wherein the second flip-flop, in operation, switches the generated indication to an active state in response to a second edge of the clock signal subsequent to the first edge. In an embodiment, the integrated circuit comprises isolation circuitry coupled between the first circuitry and the second circuitry, wherein the isolation circuitry, in operation, in response to an isolation signal generated by the first circuitry, selectively passes: the replicated reset signal from the first circuitry to the second circuitry; and the generated indication of whether a threshold period of time has elapsed from the second circuitry to the first circuitry. In an embodiment, the isolation circuitry comprises: a first logic gate having: an input coupled to the first circuitry, which, in operation, receives the replicated reset signal from the first circuitry; an output coupled to a reset input of the second circuitry; and a control input, which, in operation, receives an isolation control signal; and a second logic gate having: an input coupled to the second circuitry, which, in operation, receives the generated indication of whether a threshold period of time has elapsed from the second circuitry; an output coupled to the first circuitry; and a control input, which, in operation, receives the isolation control signal, wherein the first circuitry, in operation, generates the isolation control signal.

In an embodiment, a method comprises: responding to a reset signal by generating an activation signal using first circuitry of an integrated circuit; generating, using the first circuitry, a replicated reset signal; activating second circuitry of the integrated circuit in response to the activation signal; resetting the second circuitry in response to the replicated reset signal; generating, by the second circuitry, an indication of whether a threshold period of time has elapsed since the activation of the second circuitry; and disabling, by the first circuitry, of the replicated reset signal in response to the generated indication indicating the threshold period of time has elapsed. In an embodiment, the method comprises: electrically coupling the first circuitry and the second circuitry after generating the activation signal and before generating the replicated reset signal. In an embodiment, the electrically coupling the first circuitry and the second circuitry comprises controlling isolation circuitry coupled between the first circuitry and the second circuitry. In an embodiment, first circuitry receives the reset signal. In an embodiment, the first circuitry generates the reset signal.

In an embodiment, a system, comprises: a master circuit, which, in operation, generates reset signals; and an integrated circuit coupled to the master circuit, the integrated circuit including activation circuitry and functional circuitry coupled to the activation circuitry, wherein the integrated circuit, in operation: responds to a reset signal received from the master circuit by generating an activation signal using the activation circuitry; generates, using the activation circuitry, a replicated reset signal; activates the functional circuitry of the integrated circuit in response to the activation signal; resets the functional circuitry of the integrated circuit in response to the replicated reset signal; generates, using the functional circuitry, an indication of whether a threshold period of time has elapsed since the activation of the functional circuitry; and discontinues the replicated reset signal in response to the generated indication indicating the threshold period of time has elapsed. In an embodiment, the activation circuitry comprises a flip-flop, the flip-flop including: a clock input, which, in operation, receives the reset signal; a data input, which, in operation, receives an active signal; and an erasure input, which, in operation, receives the generated indication of whether the threshold period of time has elapsed, wherein the flip-flop, in operation: switches to a stored state of operation and emits an active state signal at an output of the flip-flop in response to reception of an edge of the reset signal; and switches to an erased state of operation and emits an inactive state signal at the output of the flip-flop in response to the generated indication indicating the threshold period of time has elapsed. In an embodiment, the activation circuitry comprises a logic gate having: a first input coupled to the output of the flip-flop; a second input, which, in operation, receives the reset signal; and an output, which, in operation, emits the replicated reset signal, wherein the replicated reset signal is active when the state signal is active or when the reset signal is active. In an embodiment, the functional circuitry comprises: a clock, which, in operation, generates a clock signal when the functional circuitry is active; a first flip-flop having: a clock input, which, in operation, receives the clock signal; a data input, which, in operation, receives an inactive signal; and an output, which, in operation, emits an intermediate output signal, wherein the first flip-flop, in operation, switches the intermediate output signal to an active state in response to a first edge of the clock signal; and a second flip-flop having: a clock input, which, in operation, receives the clock signal; a data input connected to the output of the first flip-flop; and an output, which, in operation, emits the generated indication of whether a threshold period of time has elapsed since the activation of the functional circuitry, wherein the second flip-flop, in operation, switches the generated indication to an active state in response to a second edge of the clock signal subsequent to the first edge. In an embodiment, the integrated circuit comprises isolation circuitry coupled between the activation circuitry and the functional circuitry, wherein the isolation circuitry, in operation, in response to an isolation signal generated by the first circuitry, selectively passes: the replicated reset signal from the activation circuitry to the functional circuitry; and the generated indication of whether a threshold period of time has elapsed from the functional circuitry to the activation circuitry. In an embodiment, the isolation circuitry comprises: a first logic gate having: an input coupled to the activation circuitry, which, in operation, receives the replicated reset signal from the first circuitry; an output coupled to a reset input of the functional circuitry; and a control input, which, in operation, receives an isolation control signal; and a second logic gate having: an input coupled to the functional circuitry, which, in operation, receives the generated indication of whether a threshold period of time has elapsed from the functional circuitry; an output coupled to the activation circuitry; and a control input, which, in operation, receives the isolation control signal, wherein the activation circuitry, in operation, generates the isolation control signal. In an embodiment, the master circuit comprises a switch.

In an embodiment, a non-transitory computer-readable medium's contents configure an integrated circuit to perform a method, the method comprising: responding to a reset signal by generating an activation signal; generating a replicated reset signal; activating functional circuitry of the integrated circuit in response to the activation signal; resetting the functional circuitry in response to the replicated reset signal; generating an indication of whether a threshold period of time has elapsed since the activation of the functional circuitry; and disabling of the replicated reset signal in response to the generated indication indicating the threshold period of time has elapsed. In an embodiment, the method comprises: electrically coupling activation circuitry of the integrated circuit and the functional circuitry after generating the activation signal and before generating the replicated reset signal. In an embodiment, the contents comprise instructions executed by processing circuitry of the integrated circuit.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
first circuitry;
second circuitry; and
isolation circuitry coupled between the first circuitry and the second circuitry, wherein
the first circuitry, in operation, responds to a reset signal by:
generating an activation signal; and
generating a replicated reset signal; and
the second circuitry, in operation:
activates in response to the activation signal;
resets in response to the replicated reset signal; and
generates an indication of whether a threshold period of time has elapsed since the activation of the second circuitry, wherein the first circuitry, in operation, disables the replicated reset signal in response to the generated indication indicating the threshold period of time has elapsed; and
the isolation circuitry, in operation, in response to an isolation signal generated by the first circuitry, selectively passes:
the replicated reset signal from the first circuitry to the second circuitry; and
the generated indication of whether a threshold period of time has elapsed from the second circuitry to the first circuitry.

2. The integrated circuit of claim 1, wherein the isolation circuitry comprises:
a first logic gate having:
an input coupled to the first circuitry, which, in operation, receives the replicated reset signal from the first circuitry;
an output coupled to a reset input of the second circuitry; and
a control input, which, in operation, receives the isolation signal; and
a second logic gate having:
an input coupled to the second circuitry, which, in operation, receives the generated indication of whether a threshold period of time has elapsed from the second circuitry;
an output coupled to the first circuitry; and
a control input, which, in operation, receives the isolation signal, wherein the first circuitry, in operation, generates the isolation signal.

3. An integrated circuit, comprising:
first circuitry; and
second circuitry coupled to the first circuitry, wherein
the first circuitry, in operation, responds to a reset signal by:
generating an activation signal; and
generating a replicated reset signal; and
the second circuitry, in operation:
activates in response to the activation signal;
resets in response to the replicated reset signal; and
generates an indication of whether a threshold period of time has elapsed since the activation of the second circuitry, wherein the first circuitry, in operation, disables the replicated reset signal in response to the generated indication indicating the threshold period of time has elapsed, wherein:

the first circuitry comprises a flip-flop, the flip-flop including:

a clock input, which, in operation, receives the reset signal;

a data input, which, in operation, receives an active signal; and an erasure input, which, in operation, receives the generated indication of whether the threshold period of time has elapsed, wherein the flip-flop, in operation:

switches to a stored state of operation and emits an active state signal at an output of the flip-flop in response to reception of an edge of the reset signal; and switches to an erased state of operation and emits an inactive state signal at the output of the flip-flop in response to the generated indication indicating the threshold period of time has elapsed.

4. The integrated circuit according to claim 3, wherein:

the first circuitry comprises a logic gate having:

a first input coupled to the output of the flip-flop;

a second input, which, in operation, receives the reset signal; and an output, which, in operation, emits the replicated reset signal, wherein the replicated reset signal is active if the state signal is active or if the reset signal is active.

5. The integrated circuit according to claim 3, comprising isolation circuitry coupled between the first circuitry and the second circuitry, wherein the isolation circuitry, in operation, in response to an isolation signal generated by the first circuitry, selectively passes:

the replicated reset signal from the first circuitry to the second circuitry; and the generated indication of whether a threshold period of time has elapsed from the second circuitry to the first circuitry.

6. The integrated circuit of claim 5, wherein the isolation circuitry comprises:

a first logic gate having:

an input coupled to the first circuitry, which, in operation, receives the replicated reset signal from the first circuitry;

an output coupled to a reset input of the second circuitry; and a control input, which, in operation, receives the isolation signal; and a second logic gate having:

an input coupled to the second circuitry, which, in operation, receives the generated indication of whether a threshold period of time has elapsed from the second circuitry;

an output coupled to the first circuitry; and a control input, which, in operation, receives the isolation signal, wherein the first circuitry, in operation, generates the isolation signal.

7. An integrated circuit, comprising:

first circuitry; and second circuitry coupled to the first circuitry, wherein the first circuitry, in operation, responds to a reset signal by:

generating an activation signal; and generating a replicated reset signal; and the second circuitry, in operation:

activates in response to the activation signal;

resets in response to the replicated reset signal; and generates an indication of whether a threshold period of time has elapsed since the activation of the second circuitry, wherein the first circuitry, in operation, disables the replicated reset signal in response to the generated indication indicating the threshold period of time has elapsed, wherein the second circuitry comprises:

a clock, which, in operation, generates a clock signal when the second circuitry is active;

a first flip-flop comprising:

a clock input, which, in operation, receives the clock signal;

a data input, which, in operation, receives an inactive signal; and an output, which, in operation, emits an intermediate output signal, wherein the first flip-flop, in operation, switches the intermediate output signal to an active state in response to a first edge of the clock signal; and a second flip-flop comprising:

a clock input, which, in operation, receives the clock signal;

a data input connected to the output of the first flip-flop; and an output, which, in operation, emits the generated indication of whether a threshold period of time has elapsed since the activation of the second circuitry, wherein the second flip-flop, in operation, switches the generated indication to an active state in response to a second edge of the clock signal subsequent to the first edge.

8. The integrated circuit according to claim 7, comprising isolation circuitry coupled between the first circuitry and the second circuitry, wherein the isolation circuitry, in operation, in response to an isolation signal generated by the first circuitry, selectively passes:

the replicated reset signal from the first circuitry to the second circuitry; and the generated indication of whether a threshold period of time has elapsed from the second circuitry to the first circuitry.

9. The integrated circuit of claim 8, wherein the isolation circuitry comprises:

a first logic gate having:

an input coupled to the first circuitry, which, in operation, receives the replicated reset signal from the first circuitry;

an output coupled to a reset input of the second circuitry; and a control input, which, in operation, receives the isolation signal; and a second logic gate having:

an input coupled to the second circuitry, which, in operation, receives the generated indication of whether a threshold period of time has elapsed from the second circuitry;

an output coupled to the first circuitry; and a control input, which, in operation, receives the isolation signal, wherein the first circuitry, in operation, generates the isolation signal.

10. A method, comprising:

responding to a reset signal by generating an activation signal using first circuitry of an integrated circuit;

generating, using the first circuitry, a replicated reset signal;

activating second circuitry of the integrated circuit in response to the activation signal;

resetting the second circuitry in response to the replicated reset signal;

generating, by the second circuitry, an indication of whether a threshold period of time has elapsed since the activation of the second circuitry; and disabling, by the first circuitry, of the replicated reset signal in response to the generated indication indicating the threshold period of time has elapsed, wherein:

the method comprises electrically coupling the first circuitry and the second circuitry after generating the activation signal and before generating the replicated reset signal;

the electrically coupling the first circuitry and the second circuitry comprises controlling isolation circuitry coupled between the first circuitry and the second circuitry to, in response to an isolation signal generated by the first circuitry, selectively pass:

the replicated reset signal from the first circuitry to the second circuitry; and the generated indication of whether a threshold period of time has elapsed from the second circuitry to the first circuitry.

11. The method according to claim 10, wherein the first circuitry receives the reset signal.

12. A system, comprising:

a master circuit, which, in operation, generates reset signals; and an integrated circuit coupled to the master circuit, the integrated circuit including activation circuitry and functional circuitry coupled to the activation circuitry, wherein the integrated circuit, in operation:

responds to a reset signal received from the master circuit by generating an activation signal using the activation circuitry;

generates, using the activation circuitry, a replicated reset signal;

activates the functional circuitry of the integrated circuit in response to the activation signal;

resets the functional circuitry of the integrated circuit in response to the replicated reset signal;

generates, using the functional circuitry, an indication of whether a threshold period of time has elapsed since the activation of the functional circuitry; and discontinues the replicated reset signal in response to the generated indication indicating the threshold period of time has elapsed, wherein:

the integrated circuit comprises isolation circuitry coupled between the activation circuitry and the functional circuitry; and the isolation circuitry, in operation, in response to an isolation signal generated by the first circuitry, selectively passes:

the replicated reset signal from the activation circuitry to the functional circuitry; and the generated indication of whether a threshold period of time has elapsed from the functional circuitry to the activation circuitry.

13. The system according to claim 12, wherein the activation circuitry comprises a flip-flop, the flip-flop including:

a clock input, which, in operation, receives the reset signal;

a data input, which, in operation, receives an active signal; and an erasure input, which, in operation, receives the generated indication of whether the threshold period of time has elapsed, wherein the flip-flop, in operation:

switches to a stored state of operation and emits an active state signal at an output of the flip-flop in response to reception of an edge of the reset signal; and switches to an erased state of operation and emits an inactive state signal at the output of the flip-flop in response to the generated indication indicating the threshold period of time has elapsed.

14. The system according to claim 13, wherein the activation circuitry comprises a logic gate having:

a first input coupled to the output of the flip-flop;

a second input, which, in operation, receives the reset signal; and an output, which, in operation, emits the replicated reset signal, wherein the replicated reset signal is active when the state signal is active or when the reset signal is active.

15. The system according to claim 12, wherein the functional circuitry comprises:

a clock, which, in operation, generates a clock signal when the functional circuitry is active;

a first flip-flop having:

a clock input, which, in operation, receives the clock signal;

a data input, which, in operation, receives an inactive signal; and an output, which, in operation, emits an intermediate output signal, wherein the first flip-flop, in operation, switches the intermediate output signal to an active state in response to a first edge of the clock signal; and a second flip-flop having:

a clock input, which, in operation, receives the clock signal;

a data input connected to the output of the first flip-flop; and an output, which, in operation, emits the generated indication of whether a threshold period of time has elapsed since the activation of the functional circuitry, wherein the second flip-flop, in operation, switches the generated indication to an active state in response to a second edge of the clock signal subsequent to the first edge.

16. The system according to claim 12, wherein the isolation circuitry comprises:

a first logic gate having:

an input coupled to the activation circuitry, which, in operation, receives the replicated reset signal from the first circuitry;

an output coupled to a reset input of the functional circuitry; and a control input, which, in operation, receives the isolation signal; and a second logic gate having:

an input coupled to the functional circuitry, which, in operation, receives the generated indication of whether a threshold period of time has elapsed from the functional circuitry;

an output coupled to the activation circuitry; and a control input, which, in operation, receives the isolation signal, wherein the activation circuitry, in operation, generates the isolation signal.

17. The system according to claim 12, wherein the master circuit comprises a switch.

18. A non-transitory computer-readable medium having contents which configure an integrated circuit to perform a method, the method comprising:

responding to a reset signal by generating an activation signal using first circuitry of the integrated circuit;

generating, using the first circuitry, a replicated reset signal;

activating functional circuitry of the integrated circuit in response to the activation signal;

resetting the functional circuitry in response to the replicated reset signal;

generating an indication of whether a threshold period of time has elapsed since the activation of the functional circuitry; and disabling of the replicated reset signal in response to the generated indication indicating the threshold period of time has elapsed, wherein:

the method comprises electrically coupling the first circuitry and the functional circuitry after generating the activation signal and before generating the replicated reset signal;

the electrically coupling the first circuitry and the functional circuitry comprises controlling isolation circuitry coupled between the first circuitry and the functional circuitry to, in response to an isolation signal generated by the first circuitry, selectively pass:

the replicated reset signal from the first circuitry to the functional circuitry; and the generated indication of whether a threshold period of time has elapsed from the functional circuitry to the first circuitry.

19. The non-transitory computer-readable medium according to claim 18, wherein the contents comprise instructions executed by processing circuitry of the integrated circuit.

* * * * *